(12) United States Patent
Meghelli

(10) Patent No.: US 6,577,694 B1
(45) Date of Patent: Jun. 10, 2003

(54) BINARY SELF-CORRECTING PHASE DETECTOR FOR CLOCK AND DATA RECOVERY

(75) Inventor: Mounir Meghelli, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/435,838

(22) Filed: Nov. 8, 1999

(51) Int. Cl.[7] .................................................. H03D 3/24
(52) U.S. Cl. ........................ 375/373; 375/375; 327/12; 327/43
(58) Field of Search ..................... 375/359, 355, 375/360, 362, 371, 373, 375; 327/9, 12, 10, 42, 43, 93, 141, 142, 147, 156, 162, 159

(56) References Cited

U.S. PATENT DOCUMENTS

| | | | |
|---|---|---|---|
| 4,222,009 A | * 9/1980 | Moulton et al. | 327/20 |
| 4,535,459 A | 8/1985 | Hogge, Jr. | |
| 4,663,769 A | * 5/1987 | Krinock | 375/359 |
| 5,012,494 A | 4/1991 | Lai et al. | |
| 5,126,602 A | * 6/1992 | Lee et al. | 327/10 |
| 5,233,636 A | * 8/1993 | Lee et al. | 375/373 |
| 5,329,559 A | * 7/1994 | Wong et al. | 375/373 |
| 5,550,878 A | * 8/1996 | Shigaki et al. | 375/373 |
| 5,592,125 A | 1/1997 | Williams | |
| 5,850,422 A | 12/1998 | Chen | |
| 5,923,190 A | * 7/1999 | Yamaguchi | 327/12 |
| 6,081,572 A | * 6/2000 | Filip | 375/376 |
| 6,351,154 B2 | * 2/2002 | Brachmann et al. | 327/12 |

* cited by examiner

*Primary Examiner*—Chi Pham
*Assistant Examiner*—Khanh Cong Tran
(74) *Attorney, Agent, or Firm*—Thu Ann Dang, Esq.; McGinn & Gibb, PLLC

(57) ABSTRACT

A phase detector for a clock and data recovery circuit from random non-return-to zero (NRZ) data signal includes a plurality (e.g., preferably three) edge-triggered flip-flops. The incoming NRZ data are sampled by a pair of edge-triggered flip-flops using the transition of the clock generated by the clock recovery circuit. A third edge-triggered flip-flop processes the outputs from the edge-triggered flip-flop pair to indicate whether the generated clock leads or lags the received data.

22 Claims, 3 Drawing Sheets

BINARY SELF-CORRECTING PHASE DETECTOR FOR CLOCK AND DATA RECOVERY

BACKGROUND OF THE INVENTION

1. Field of the Invention

The present invention generally relates to data transmission and communication systems, and more particularly to a phase detector used in a clock recovery system for recovering a clock signal from transmitted NRZ (non-return-to-zero) data. Also, the phase detector of the present invention provides the retimed or regenerated data directly from the transmitted NRZ data utilizing the recovered clock signal.

2. Description of the Related Art

When data are transmitted over a communication link, the associated clock signal is generally not transmitted, thereby providing for better efficiency of the link. However, the clock signal is necessary to retime or regenerate the received data which is typically corrupted by noise due to the physical medium and electronic and/or optical devices in the case of a transmission over an optical (e.g., glass) fiber. The clock signal also provides timing necessary for subsequent digital circuitry such as demultiplexers or framers. Therefore, transmission systems generally require that the clock signal at the receiving end of the link be extracted from the incoming data signal.

In the conventional systems, two main techniques are usually used for clock recovery. That is, direct extraction techniques and phase-locked loop (PLL) techniques are used.

In a direct extraction scheme, a high Q bandpass filter is required among other circuits. However, these high Q bandpass filters are generally expensive and limit the link to work only at a single data rate. Also, direct extraction techniques are difficult to integrate therein. In that case, phase shifters are used to ensure adequate alignment between the extracted clock and the received data. This alignment is temperature- and process-dependent and will vary depending on the circuitry used.

In PLL techniques, a reference clock is generated at the frequency of the received data usually using a voltage-controlled oscillator (VCO). A phase detector circuit compares the phase angle between the VCO clock signal and the received data stream. The phase detector provides a control signal which is a function of the relative phase between the VCO clock signal and the received data signal. This control signal is used to adjust the VCO frequency until the clock signal is synchronized with the received data.

The phase detector (PD) is a key circuit for clock and data recovery applications using PLL techniques, especially when the timing becomes critical as the data rate increases. As frequencies become higher, time delays inherent in digital circuits become more significant compared to the bit interval. The bit error rate (BER) of a transmission system (e.g., a measure of the number of erroneous data bits received divided by the total number of data bits received in a specified transmission time) is very dependent on the quality of the extracted clock by timing jitter, and also on how well the extracted clock signal is properly aligned with the received data.

To ensure optimum bit error rate when sampling the received data with the extracted clock for data regeneration, it is desirable to sample at the midpoint of each bit interval. At very high speeds (e.g., a few GHz to tens of GHz), a misalignment of even a few picoseconds can dramatically increase the transmission system's bit error rate.

Two main PD circuits (e.g., linear PDs and binary PDs) are usually used in clock and data recovery applications. Linear PDs may not work well at extremely high bit rates because they must generate relatively narrow pulses compared to the bit interval as the phase error becomes smaller. Consequently, they suffer from a relatively large static phase error which is not desirable for optimum sampling of the received data. Binary PDs (e.g., also known as "bang-bang" PDs or "earlyllate" PDs) can generate a much smaller static phase error as compared to linear PDs.

A desirable feature to enhance the clock and data alignment is that the retiming decision circuit, used to regenerate the received data, be fully part of (e.g., integrated with) the PD operation. That is, no phase adjustment is required if the PD automatically aligns the extracted clock with the received data such that the sampling of the data occurs at the midpoint of each bit interval. Therefore, no sensitive phase adjustment is required.

Presently, complex PD architectures are used to ensure optimum sampling of the received data. For high speed applications, these complex architectures have two major drawbacks: power consumption and layout complexity. Indeed, circuit performance is very sensitive to layout parasitics at high frequency operation. The parasitic elements associated with interconnect wires cause loading and coupling effects that degrade the frequency behavior and the noise performance of the circuits. Moreover, clock distribution within the PD circuit also must be carefully considered during layout design.

Therefore, a simple and efficient PD is required, especially when targeting very high data rate transmission applications. Hitherto the present invention, such a simple and efficient PD has not been developed or achieved.

SUMMARY OF THE INVENTION

In view of the foregoing and other problems, disadvantages, and drawbacks of the conventional methods and structures, an object of the present invention is to provide a method and circuit for a phase detector used in phase-locked loops (PLLs) for clock and data recovery from a random NRZ data signal.

In a first aspect of the invention, a phase detector, includes a first flip-flop for sampling an incoming data signal in accordance with a local clock signal to produce a first sampled data signal, a second flip-flop for sampling the incoming data signal in accordance with the local clock signal to produce a second sampled data signal, and a third flip-flop for sampling the second sampled data signal with the first sampled data signal, to produce a binary control signal.

In a second aspect of the invention, a phase detector circuit is provided which is used in a clock and data recovery system for synchronizing a received non-return-to-zero (NRZ) data signal with a clock signal generated by a clock source, the clock signal having a period equal to the unit bit interval of the received NRZ data signal, the phase detector for regenerating the received NRZ data signal using the clock signal. The phase detector includes a first flip-flop, including data and clock input terminals for respectively receiving a data input and a clock: input, and an output terminal for providing an output, a second flip-flop, including data and clock input terminals for respectively receiving the data input and an inverted clock input, and an output terminal for providing an output, and a third flip-flop, including data and clock input terminals for respectively receiving an output from the second flip-flop and an inverted output from the first flip-flop, and an output terminal for providing an output.

In a third aspect of the invention, a phase detector includes a data signal input for supplying input data and opposite phase input data of said input data, a clock signal input for supplying an input clock and an opposite phase input clock of the input clock, a first flip-flop, including differential data D and DB input terminals, differential clock C and CB input terminals and differential Q and QB output terminals, the first flip-flop receiving input data at the differential data input terminals and the input clock at the differential clock input terminals, a second flip-flop, including differential data D and DB input terminals, differential clock C and CB input terminals and differential Q and QB output terminals, the second flip-flop receiving input data at the differential data input terminals and the input clock at the differential clock input terminals; and a third flip-flop, including differential data D and DB input terminals, differential clock C and CB input terminals and differential Q and QB output terminals, the third flip-flop receiving a differential output from the second flip-flop at the differential data input terminals of the third flip-flop and receiving a differential output from the first flip flop at differential clock input terminals of the third flip-flop.

In a fourth aspect, of the invention, includes a phase detector circuit including a plurality of edge-triggered flip-flops, wherein incoming data are sampled by first and second flip-flops of the plurality of flip-flops by using a transition of a clock generated by the system, and wherein a third edge-triggered flip-flop of the plurality of flip-flops processes outputs from the first and second flip-flops to indicate whether the generated clock leads or lags the incoming data received.

The invention also includes a clock and data recovery system including such a phase. detector, and a method for regenerating a data signal and/or recovering a clock signal.

With the present invention, preferably the phase detector operates directly on the random NRZ data signal without any signal processing. The phase detector has an early-late type of operation for small static phase errors. The retiming function for data regeneration is fully part of the phase detector operation for better clock and data alignment.

Additionally, no phase adjustment is required since the phase detector automatically aligns the falling or the rising clock edges at the center of the incoming data bit interval for optimum sampling. Therefore, the optimum sampling point is maintained over process, temperature and power supply variation, as well as aging.

Preferably, the inventive phase detector includes only three edge-triggered flip-flops with the clock signal used by only two of the flip-flops which simplify significantly clock distribution during implementation. Only the in-phase clock signal and its complement are required, which are easy to obtain especially in a differential architecture. The low complexity of the phase detector architecture makes it very well suited for low power and high frequency operations.

In an exemplary first embodiment of the present invention, a random NRZ data stream and a clock signal are received through a pair of edge-triggered flip-flops. In the first flip-flop, the clock signal samples the received data on each falling edge. In the second flip-flop, the clock signal samples the received data on each rising edge. Then, a third flip-flop is used to sample the output of the second flip-flop on each rising edge of the output of the first flip-flop. The output (e.g., a binary signal) of the third flip-flop indicates whether rising edges of the clock signal are early or late with respect to transitions of the received data. Such phase detectors are known as binary (or "early-late", or "bang-bang", or "lead-lag") phase detectors.

Additionally, the phase detector of the present invention provides directly the retimed or regenerated data of the received random NRZ data stream without requiring any phase adjustment when used in a clock and data recovery system.

In a second embodiment of the present invention, a phase detector employing differential logic is provided. This results in a better clock and data alignment for optimum sampling, especially for high data rate transmission systems (e.g., usually in GHz to tens of Ghz range; that is, usually above b 1GHz is considered a "high" frequency).

Therefore, with the present invention, a simple and efficient PD is provided, which is especially useful when targeting very high (e.g., 1 Gb/s to tens of Gb/s) data rate transmission applications.

BRIEF DESCRIPTION OF THE DRAWINGS

The foregoing and other purposes, aspects and advantages will be better understood, from the following detailed description of preferred embodiments of the invention with reference to the drawings, in which.

DETAILED DESCRIPTION OF PREFERRED EMBODIMENTS OF THE INVENTION

Figure 1:
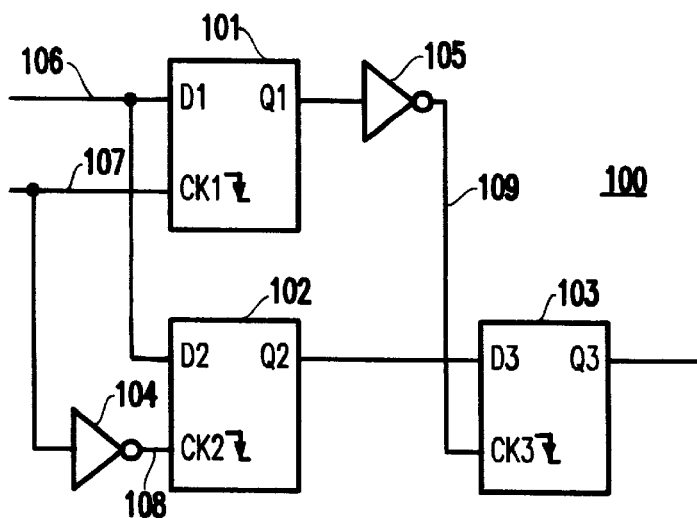
FIG. 1 is a block diagram of a phase detector 100 according to a first embodiment of the invention.

Referring now to the drawings, and more particularly to FIGS. 1–4, there are shown preferred embodiments of the method and structures according to the present invention.

First Embodiment

Figure 2A:
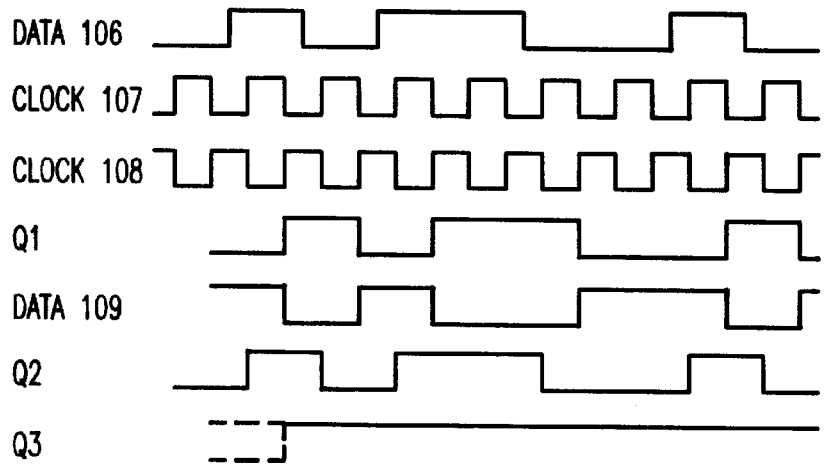
FIG. 2A is a timing diagram illustrating waveforms of the phase detector 100 according to the first embodiment of the present invention when the clock signal is lagging the data.
Figure 2B:
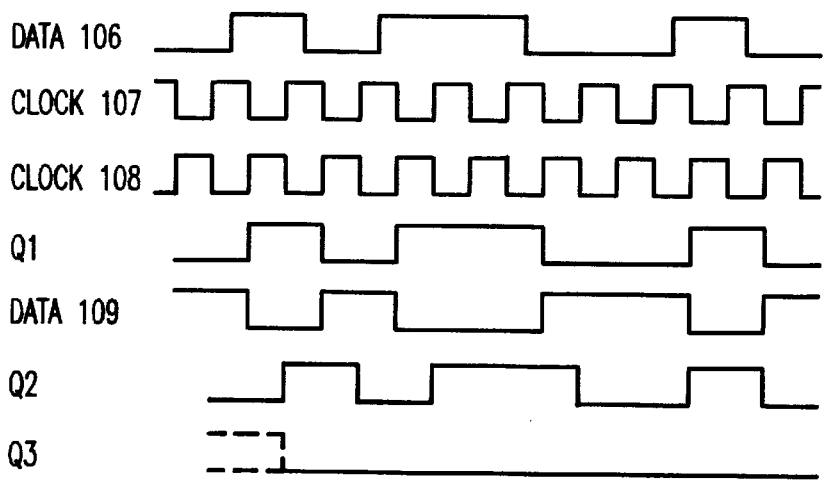
FIG. 2B is a timing diagram illustrating waveforms of the first embodiment of the present invention when the clock signal is leading the data.

Referring to FIGS. 1–2B, a first embodiment of the present invention will be described below.

FIG. 1 illustrates the structure of a phase detector 100 according to the first embodiment of the present invention. The phase detector 100 includes a plurality (e.g., preferably three) of falling edge-triggered flip-flops 101, 102 and 103.

A random data stream 106 is received in the data input D1 of flip-flop 101 and in the data input D2 of flip-flop 102. It is noted that the invention is optimized with a Non-Return-to-Zero (NRZ) data stream in which the bit period is matched to the frequency of the clock.

The phase detector 100 also includes an inverter 104 for receiving a clock signal 107 from a clock generator (not illustrated) to produce an inverted phase clock signal 108. The clock signal 107 and the inverted phase clock signal 108 are applied to the clock input CK1 of flip-flop 101 and to the clock input CK2 of flip-flop 102, respectively, thereby causing the: received data signal 106 to be sampled by the falling edges of clock signal (inverted) 108 and the falling edges of clock signal 107. Therefore, the output Q1 of flip-flop 101 and the output Q2 from flip-flop 102 are identical and shifted from one another by a one-half period of clock signal 107. Output Q1 will be leading or lagging output Q2 depending on the relative phase of clock signal 107 and data signal 106.

Signal 109 from inverter 105 (e.g., the inverted phase signal of Q1) is received in the clock input CK3 of flip-flop 103. The output Q2 of flip-flop 102 is received in the data input D3 of flip-flop 103. Therefore, the falling edges of the signal 109 sample the output Q2 of the flip-flop 102. Thus, output Q3 of flip-flop 103 indicates whether output Q1 of flip-flop 101 is leading or lagging output Q2 of flip-flop 102. Thus, based on output Q3, the falling edges of the clock signal can be aligned at the midpoint of each bit interval of the received data and the data can be recovered.

Hereinbelow, the above operation is described in further detail with two examples illustrated with FIG. 2A and FIG. 2B.

FIG. 2A illustrates the situation in which transitions of received data 106 occur when clock signal 107 is low (e.g., has a low value "0"). In other words, FIG. 2A illustrates the situation in which transitions of received data 106 precede rising edges of clock signal 107. In this situation, the output Q1 of flip-flop 101 lags the output Q2 of flip-flop 102. Therefore, the output Q3 of flip-flop 103 is at a high logic level (e.g., a "1").

FIG. 2B illustrates the situation in which transitions of received data 106 occur when clock signal 107 is high (e.g., "1"). In other words, FIG. 2B illustrates the situation in which rising edges of clock signal 107 precede transitions of received data 106. In this situation, the output Q1 of flip-flop 101 leads the output Q2 of flip-flop 102. Therefore, the output Q3 of flip-flop 103 is at a low logic level (e.g., "0")

As a result, in this first embodiment of the present invention, output Q3 of flip-flop 103 will always be a logic level low (e.g., "0") when rising edges of clock signal 107 lead the received data 106 and a logic level high (e.g., "1") when rising edges of clock signal 107 lag the received data 106.

When the phase detector of the present invention, as described above in the first embodiment, is used in a PLL circuit as a phase comparator, the falling edges of the clock signal 108 from inverter 104 are aligned with the transitions of the received data 106 when lock conditions are achieved.

Therefore, the falling edges of clock signal 107 will be aligned at the midpoint of each bit interval of the received data 106 assuming a zero delay inverter 104 and a 50% duty cycle clock signal. In this situation, the output Q1 of flip-flop 101 is the regenerated data of the received data 106.

If differential logic (e.g., as described below in the second embodiment) is used to implement the phase detector 100 of the present invention, complementary signals may be used and the inverters 104 and 105 are unnecessary. Therefore, the time delay introduced by the inverters is avoided. The use of differential logic is highly recommended especially for very high speed data rates to insure proper alignment of the clock signal with the received data.

Second Embodiment

Figure 3:
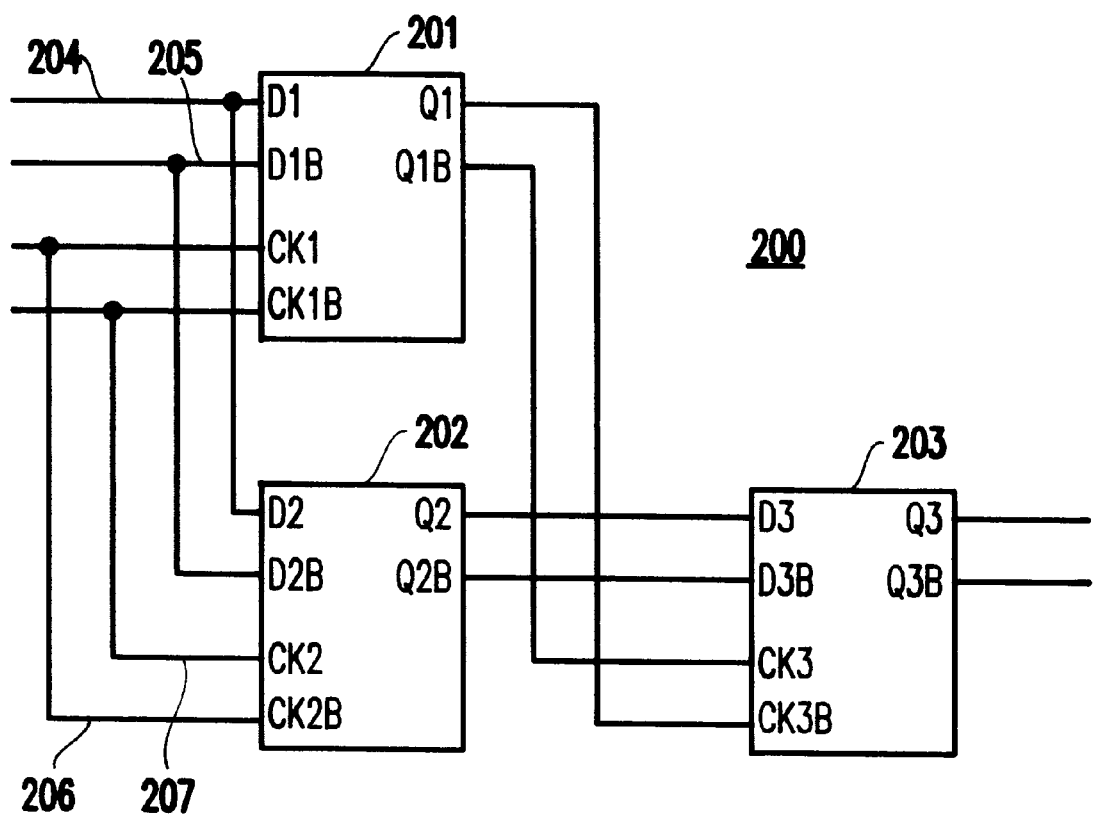
FIG. 3 is a block diagram of a phase detector 200 according to a second embodiment of the invention.

Referring to FIG. 3, a second embodiment of the invention will be described below.

FIG. 3 illustrates a phase detector 200 according to the second embodiment of the present invention using differential logic. The phase detector 200 comprises a plurality (e.g., preferably only three; but additional ones could be added, to reduce metastability, at the stage of receiving the incoming data stream) of edge-triggered flip-flops 201, 202 and 203, each one preferably having differential data and clock inputs and differential outputs.

A NRZ random data stream 204 and its complementary signal 205 are received respectively, in the complementary data inputs D1 and D1B of flip-flop 201. Complementary data signals 204 and 205 are also received, respectively, in the complementary data inputs D2 and D2B of flip-flop 202.

The clock signal 206 and its complementary signal 207 are applied, respectively, to the complementary clock inputs CK1 and CK1B of flip-flop 201. Complementary clock signals 206 and 207 are also applied, respectively, to the complementary clock inputs CK2B and CK2 of flip-flop 202. The complementary outputs Q1 and Q1B of flip-flop 201 are applied to the complementary clock inputs CK3B and CK3 of flip-flop 203, and the complementary outputs Q2 and Q2B of flip-flop 202 are applied to the complementary data inputs D3 and D3B of flip-flop 203.

As a result, complementary outputs Q3 and Q3B of flip-flop 203 will indicate whether transitions of the received NRZ random data signal are early or late with respect to falling or rising edges of the clock signal. The phase detector 200 according to the second embodiment of the present invention provides the retimed or regenerated data of the received random NRZ data stream directly, without any phase adjustment required when used in a clock and data recovery system.

It is noted that the timing diagrams for the second embodiment are substantially the same as what is shown in FIGS. 2A–2B for the first embodiment.

Figure 4:
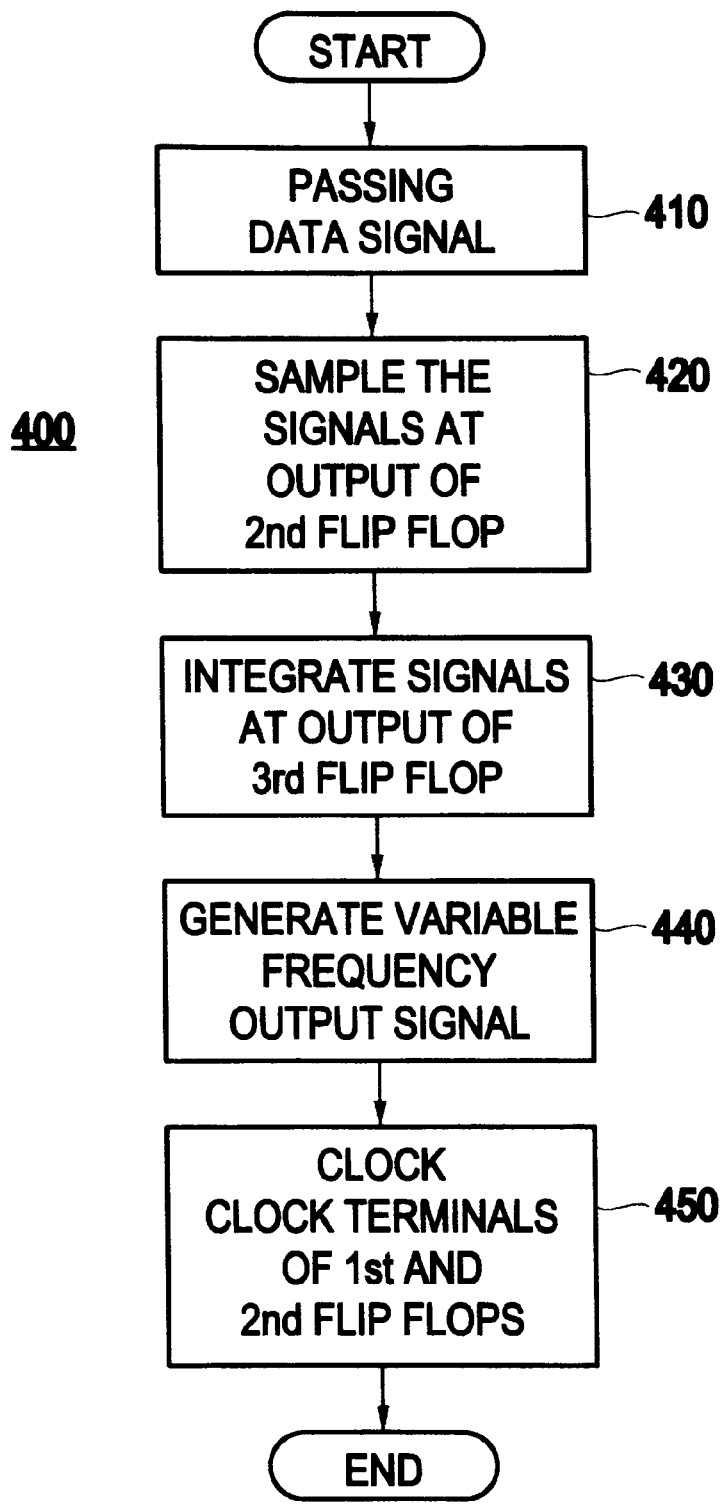
FIG. 4 illustrates a method 400 according to the present invention.

FIG. 4 illustrates a method 400 for regenerating a data signal and/or recovering a clock signal.

The method 400 includes a first step 410 of passing the data signal through a parallel connection of a first and second D-type flip-flops each including data input, clock input and output terminals.

In step 420, the signals appearing at the output terminal of the first D-type flip-flop are used to sample the signals appearing at the output terminal of the second D-type flip-flop through a third D-type flip-flop including data input, clock input, and output terminals.

In step 430, the signals appearing at the output terminal of the third D-type flip-flop are integrated to provide a control voltage.

In step 440, a variable frequency output signal is generated in response to the value of the control voltage.

Finally, in step 450, the clock terminals of the first and second D type flip-flops are clocked as a function of the variable frequency output signal.

With the unique and unobvious structure and features of the present invention, a phase detector is provided which is suitably and optimally used in a clock and data recovery system, especially at high data rates. Indeed, with the inventive phase detector, binary (e.g., early-late) type of operation for small static phase error is provided. Secondly, the self-correcting operation of the invention accommodates process, temperature and power supply variations as well as aging.

Additionally, the invention provides a retiming function as part of its operation for better clock and data alignment, and finally the present invention has a very simple architecture for low power consumption and easy clock distribution.

While several embodiments of the present invention have been described above, it should be understood that they have been provided as examples only. Thus, while the invention has been described in terms of several preferred embodiments, those skilled in the art will recognize that the invention can be practiced with modification within the spirit and scope of the appended claims.

Having thus described my invention, what I claim as new and desire to secure by letters patent is as follows:

1. A phase detector, comprising:
   a first flip-flop for sampling an incoming data signal in accordance with a local clock signal to produce a first sampled data signal;
   a second flip-flop for sampling said incoming data signal in accordance with said local clock signal to produce a second sampled data signal;
   a third flip-flop for sampling said second sampled data signal with said first sampled data signal to produce a binary control signal; and
   an inverter which is provided to receive an output from the first flip-flop and to provide an input to the third flip-flop.

2. The phase detector according to claim 1, wherein said binary control signal comprises an early-late control signal representing whether rising edges of the local clock signal are early or late with respect to transitions of the incoming data signal sampled.

3. The phase detector according to claim 1, wherein said incoming data signal comprises a Non-Return-to-Zero data stream.

4. A phase detector circuit used in a clock and data recovery system for synchronizing a received non-return-to-zero (NRZ) data signal with a clock signal generated by a clock source, said clock signal having a period equal to the unit bit interval of said received NRZ data signal, said phase detector for regenerating said received NRZ data signal using said clock signal, said phase detector comprising:
   a first flip-flop, including data and clock input terminals for respectively receiving a. data input and a clock input, and an output terminal for providing an output;
   a second flip-flop, including data and clock input terminals for respectively receiving said data input and an inverted clock input, and an output terminal for providing an output;
   a third flip-flop, including data and clock input terminals for respectively receiving an output from said second flip-flop and an inverted output from said first flip-flop, and an output terminal for providing an output.

5. The phase detector according to claim 4, further comprising:
   a data signal input device for supplying said data input; and
   a clock signal input for supplying said clock input.

6. The phase detector according to claim 4, further comprising:
   a first inverter including an input terminal for receiving said clock input and for providing said inverted clock input to said second flip-flop.

7. The phase detector according to claim 6, further comprising:
   a second inverter including an input terminal for receiving said output from said first flip-flop and for providing said inverted output to said clock terminal of said third flip-flop.

8. The phase detector according to claim 4, wherein said data input terminal of said third flip-flop receives said output of said second flip-flop.

9. The phase detector according to claim 1, wherein an output of said first flip-flop and an output of said second flip-flop are identical to one another and shifted by a predetermined period of said local clock signal.

10. The phase detector according to claim 9, wherein said predetermined period is one-half period of said local clock signal.

11. A phase detector, comprising:
    a data signal input for supplying input data and opposite phase input data of said input data;
    a clock signal input for supplying an input clock and an opposite phase input clock of said input clock;
    a first flip-flop, including differential data D and DB input terminals, differential clock C and CB input terminals and differential Q and QB output terminals, said first flip-flop receiving input data at said differential data input terminals and said input clock at said differential clock input terminals;
    a second flip-flop, including differential data D and DB input terminals, differential clock C and CB input terminals and differential Q and QB output terminals, said second flip-flop receiving input data at said differential data input terminals and said input clock at said differential clock input terminals; and
    a third flip-flop, including differential data D and DB input terminals, differential clock C and CB input terminals and differential Q and QB output terminals, said third flip-flop receiving a differential output from said second flip-flop at said differential data input terminals of said third flip-flop and receiving a differential output from said first flip flop at differential clock input terminals of said third flip-flop.

12. The phase detector according to claim 11, further comprising:
    means for connecting said input data to said D input terminal of said first flip-flop; and
    means for connecting said opposite phase input data to said DB input terminal of said first flip-flop.

13. The phase detector according to claim 11, further comprising:
    means for connecting said input data to said D input terminal of said second flip-flop; and
    means for connecting said opposite phase input data to said DB input terminal of said second flip-flop.

14. The phase detector according to claim 11, further comprising:
    means for connecting said input clock to said C input terminal of said first flip-flop; and
    means for connecting said opposite phase input clock to said CB input terminal of said first flip-flop.

15. The phase detector according to claim 11, further comprising:
    means for connecting said input clock to said CB input terminal of said second flip-flop; and
    means for connecting said opposite phase input clock to said C input terminal of said second flip-flop.

16. The phase detector according to claim 11, further comprising:
    means for connecting said Q output terminal of said first flip-flop to said CB input terminal of said third flip-flop; and
    means for connecting said QB output terminal of said first flip-flop to said C input terminal of said third flip-flop.

17. The phase detector according to claim 11, further comprising:

means for connecting said Q output terminal of said second flip-flop to said D input terminal of said third flip-flop; and means for connecting said QB output terminal of said second flip-flop to said DB input terminal of said third flip-flop.

18. A phase detector, comprising:

means for sampling an incoming data signal in accordance with a local clock signal to produce a first sampled data signal;

means for sampling said incoming data signal in accordance with said local clock signal to produce a second sampled data signal;

means for sampling said second sampled data signal with said first sampled data signal to produce an early-late control signal; and an inverter which is provided to receive an output from said means for sampling said incoming data signal, and to provide an input to said means for sampling said second sampled data signal.

19. A system for recovering a clock signal from transmitted data, comprising:

a phase detector circuit including a plurality of edge-triggered flip-flops, wherein incoming data are sampled by first and second flip-flops of said plurality of flip-flops by using a transition of a clock generated by the system, and wherein a third edge-triggered flip-flop of said plurality of flip-flops processes outputs from said first and second flip-flops to indicate whether the generated clock leads or lags the incoming data received, said system further comprising an inverter which is provided to receive an output from said first flip-flop, and to provide an input to the third edge-triggered flip flop.

20. The system according to claim 19, wherein said transmitted data comprises Non-Return-to-Zero (NRZ) data.

21. A method of data and/or clock recovery, comprising:

sampling an incoming data signal in accordance with a local clock signal to produce a first sampled data signal;

sampling said incoming data signal in accordance with said local clock signal to produce a second sampled data signal; and sampling said second sampled data signal with said first sampled data signal to produce a binary control signal, wherein said first sampled data signal is inverted to clock said sampling of said second sampled data signal.

22. A method for regenerating a data signal and/or recovering a clock signal, said method comprising:

passing the data signal through a parallel connection of first and second D-type flip-flops each including data input, clock input and output terminals;

using the signals appearing at the output terminal of the first D-type flip-flop to sample the signals appearing at the output terminal of the second D type flip-flop through a third D-type flip-flop including data input, clock input, and output terminals;

integrating the signals appearing at the output terminal of the third D-type flip-flop to provide a control voltage;

generating a variable frequency output signal in response to the value of said control voltage; and clocking the clock input terminals of said first and second D-type flip-flops as a function of said variable frequency output signal.

* * * * *